(12) United States Patent
Shimizu et al.

(10) Patent No.: US 7,565,880 B2
(45) Date of Patent: *Jul. 28, 2009

(54) PLASMA CVD APPARATUS, AND METHOD FOR FORMING FILM AND METHOD FOR FORMING SEMICONDUCTOR DEVICE USING THE SAME

(75) Inventors: Akira Shimizu, Nara (JP); Yuhsuke Fukuoka, Nara (JP); Yasushi Fujioka, Kyoto (JP); Katsushi Kishimoto, Kyoto (JP); Katsuhiko Nomoto, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 175 days.

This patent is subject to a terminal disclaimer.

(21) Appl. No.: 11/700,895

(22) Filed: Feb. 1, 2007

(65) Prior Publication Data

US 2007/0131170 A1    Jun. 14, 2007

Related U.S. Application Data

(63) Continuation of application No. 10/735,621, filed on Dec. 16, 2003, now Pat. No. 7,195,673.

(30) Foreign Application Priority Data

Dec. 18, 2002    (JP) ............................. 2002-367402

(51) Int. Cl.
*C23C 16/00* (2006.01)
(52) U.S. Cl. ................................. 118/723 E
(58) Field of Classification Search ........... 118/715, 118/718, 722, 723 R, 723 E; 156/345.43, 156/345.47
See application file for complete search history.

(56) References Cited

U.S. PATENT DOCUMENTS

| 3,241,519 | A  | 3/1966  | Lloyd           |
| 5,656,093 | A  | 8/1997  | Burkhart et al. |
| 6,827,787 | B2 | 12/2004 | Yonezawa et al. |
| 7,195,673 | B2 | 3/2007  | Shimizu et al.  |

FOREIGN PATENT DOCUMENTS

DE    33 36 652 A1    4/1985

(Continued)

OTHER PUBLICATIONS

U.S. Appl. No. 10/735,621, filed Dec. 16, 2003.

(Continued)

*Primary Examiner*—Parviz Hassanzadeh
*Assistant Examiner*—Maureen Gramaglia
(74) *Attorney, Agent, or Firm*—Nixon & Vanderhye P.C.

(57) ABSTRACT

A plasma CVD apparatus comprises an anode electrode and a cathode electrode, and is for forming a thin film on a substrate by performing plasma discharge between the anode electrode and the cathode electrode, comprising: a substrate holder disposed between the anode electrode and the cathode electrode; and one conductive member disposed between the substrate holder and one electrode of either the anode electrode or the cathode electrode, wherein the substrate holder supports the substrate, the one conductive member is provided between the one electrode and the substrate holder so as to substantially cover an entire space between the one electrode and the substrate holder, and the one conductive member is electrically connected to the one electrode and the substrate holder.

6 Claims, 10 Drawing Sheets

FOREIGN PATENT DOCUMENTS

| | | |
|---|---|---|
| JP | 63-029926 | 2/1988 |
| JP | 63-38153 | 3/1988 |
| JP | 63-121428 | 8/1988 |
| JP | 04-293782 | 10/1992 |
| JP | 2002-270600 | 9/2002 |

OTHER PUBLICATIONS

Patent Abstracts of Japan, Japanese publication No. 61163280 A dated Jul. 23, 1986.
Patent Abstracts of Japan, Japanese publication No. 62158870 A dated Jul. 14, 1987.
Patent Abstracts of Japan, Japanese publication No. 63302523 A dated Jul. 8, 1988.
Patent Abstracts of Japan, Japanese publication No. 08260145 A dated Oct. 8, 1998 and English translation of the specification.
German Office Action dated Oct. 8, 2004 in corresponding DE application No. 103 58 909.0-45.
English Translation of DE 3336652 A1.
Official English Translation of German Patent No. DE 33 36 652 A1 to Bubenzer et al., translated by the McElroy Translation Company; Jul. 2006.

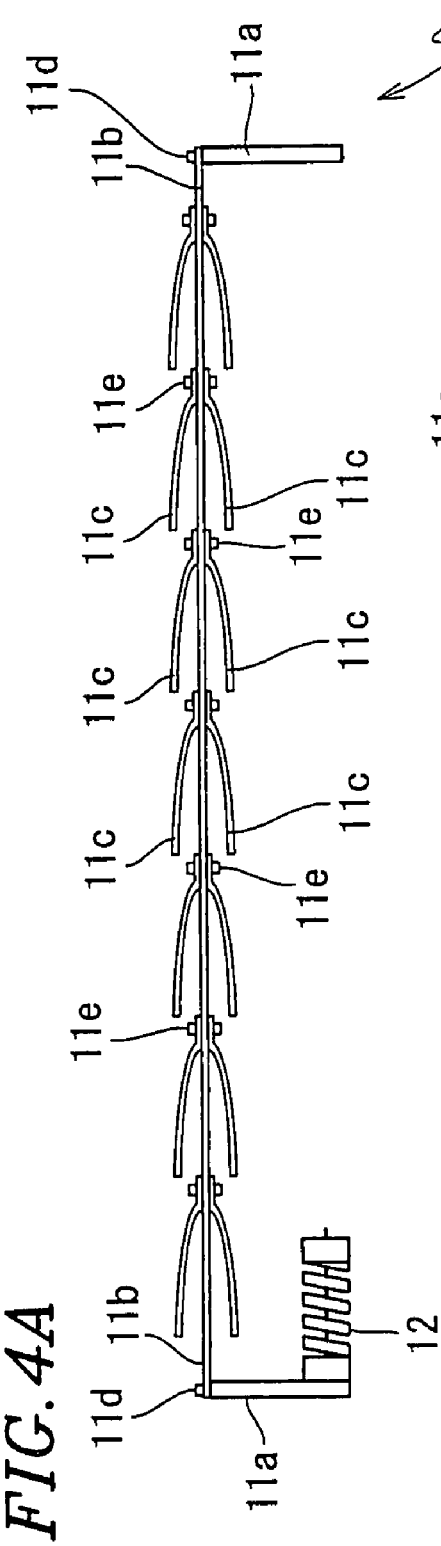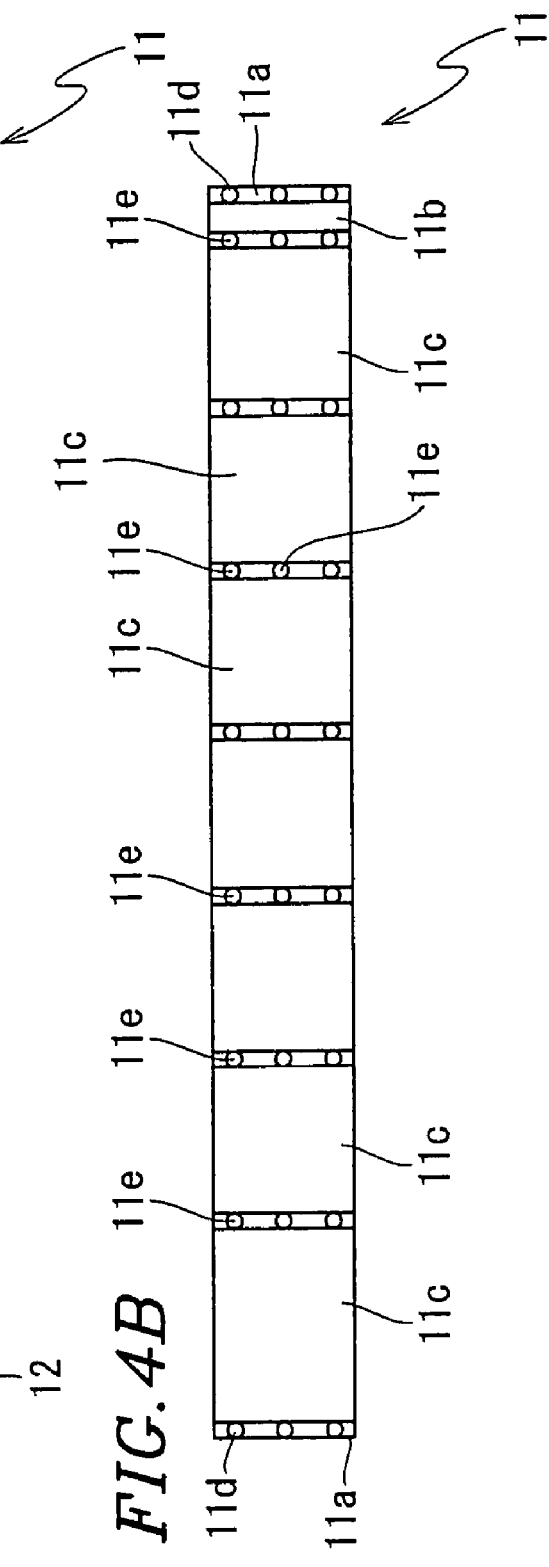

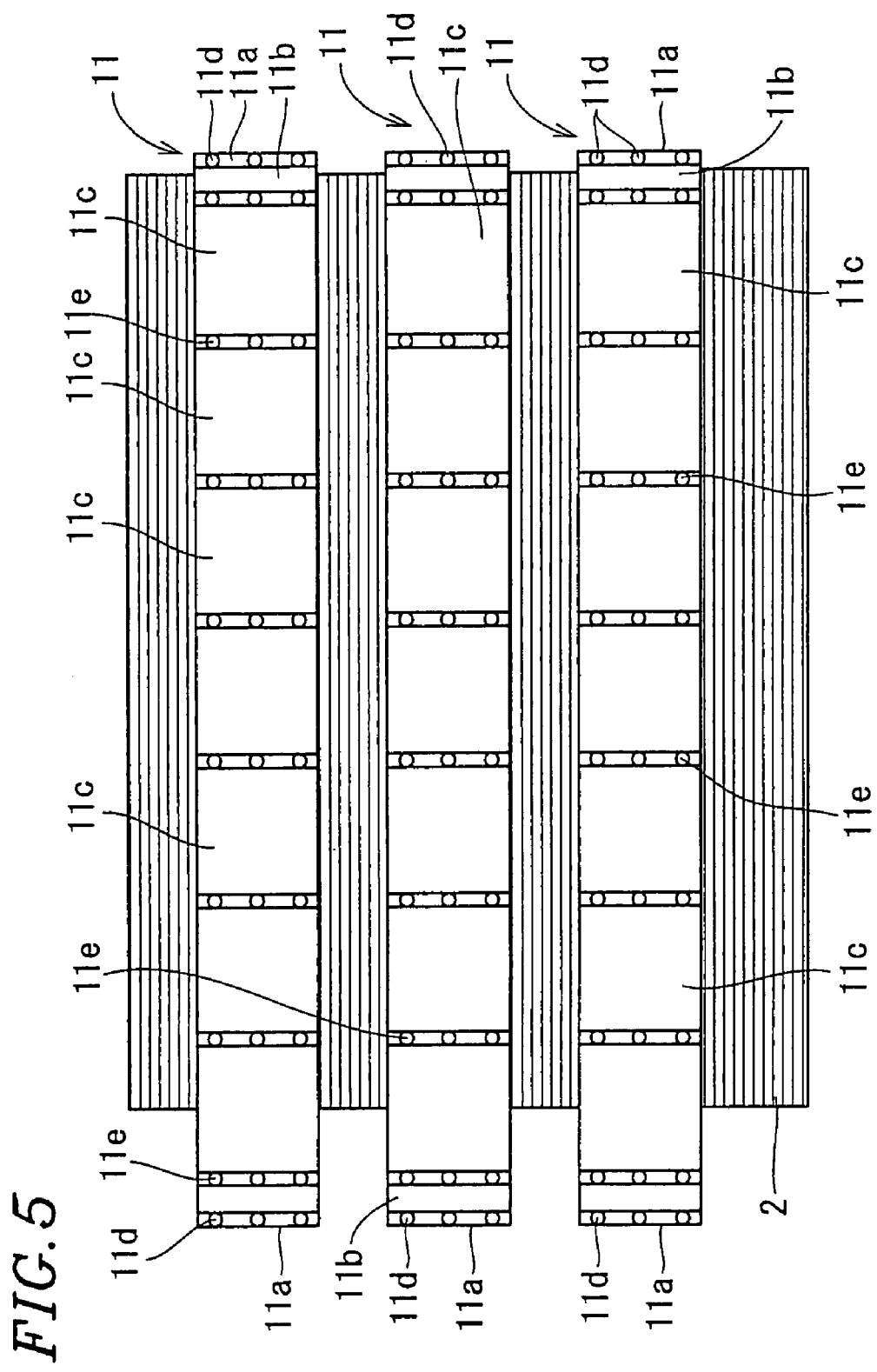

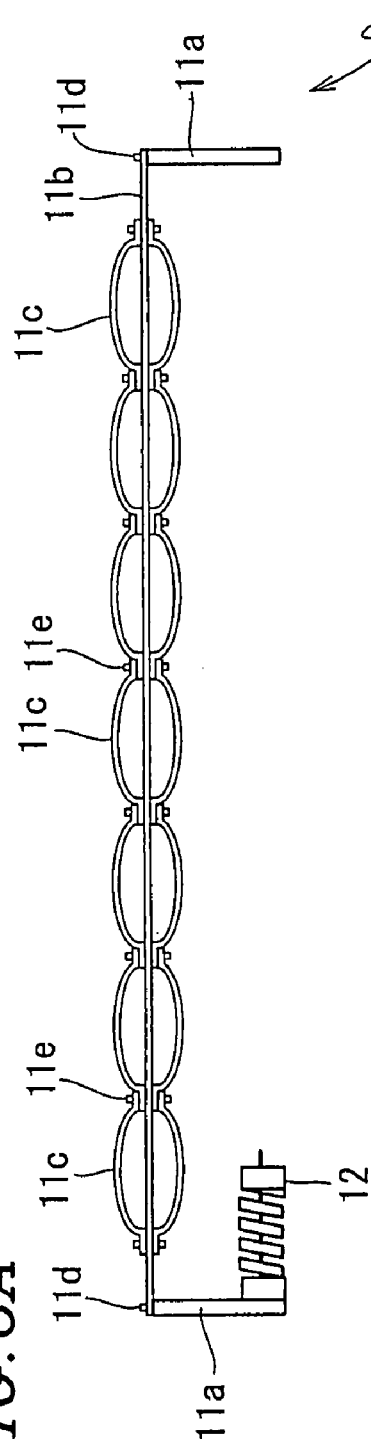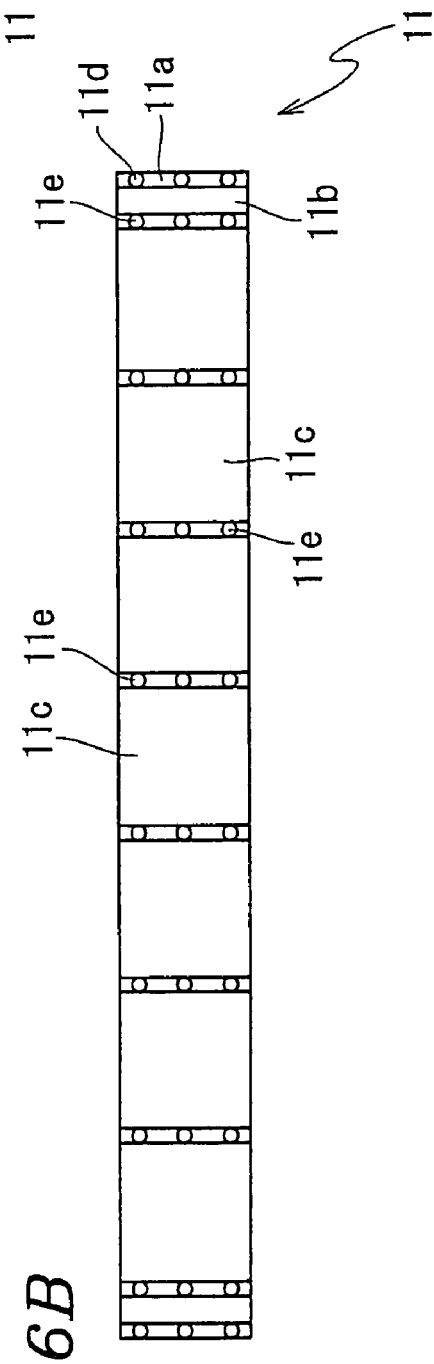

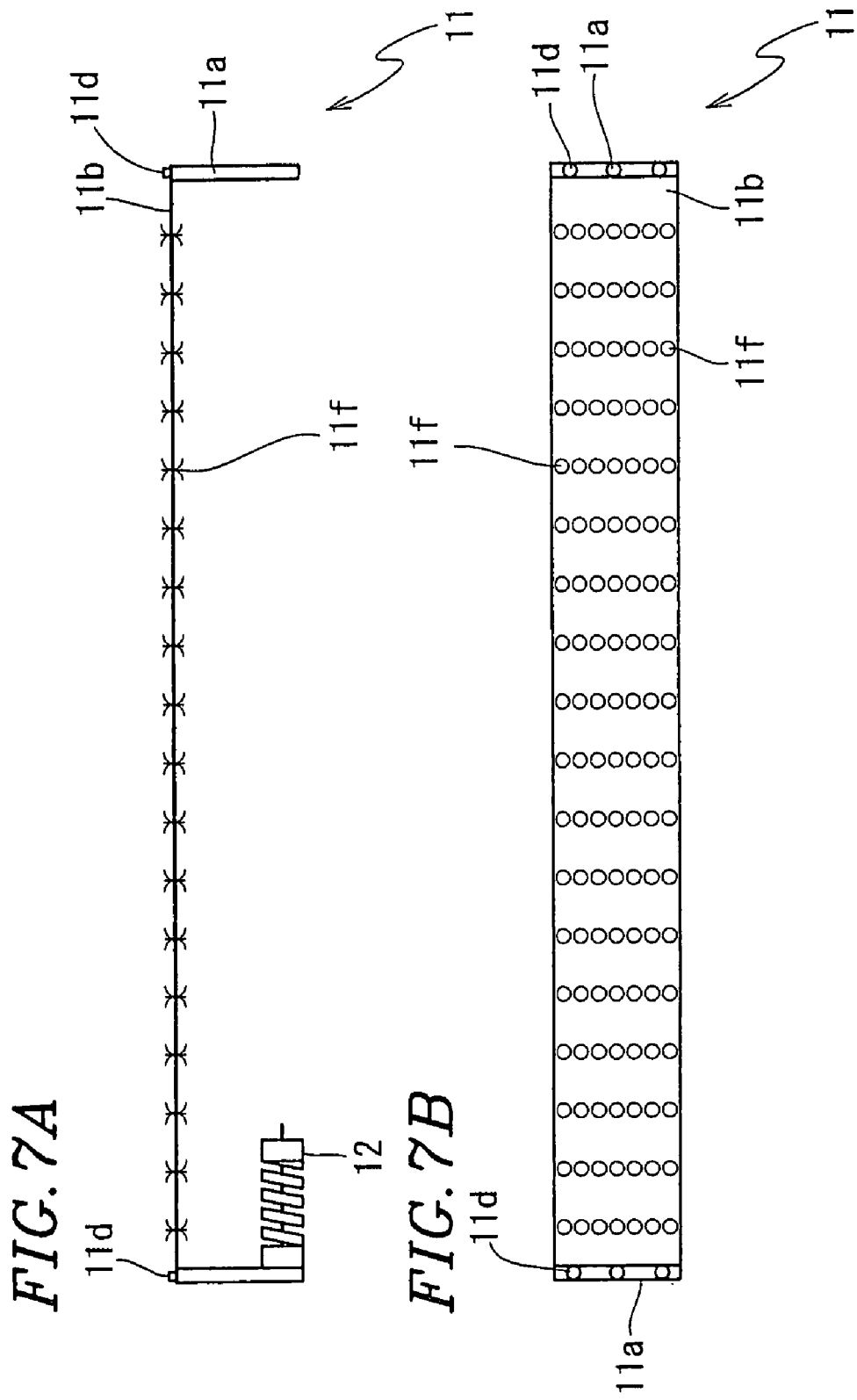

US 7,565,880 B2

PLASMA CVD APPARATUS, AND METHOD FOR FORMING FILM AND METHOD FOR FORMING SEMICONDUCTOR DEVICE USING THE SAME

This application is a Continuation of application Ser. No. 10/735,621 filed Dec. 16, 2003, now U.S. Pat. No. 7,195,673 the entire content of which is hereby incorporated herein by reference in this application.

BACKGROUND OF THE INVENTION

1. Field of the Invention

The present invention relates to a plasma CVD apparatus used for forming a thin film on a substrate such as a semiconductor substrate, and a method for forming a thin film and a method for forming a semiconductor device using the plasma CVD apparatus.

2. Description of the Related Art

A plasma CVD apparatus is used for forming a thin film on a substrate, as in the case of forming a semiconductor device such as a thin film transistor (TFT) on a semiconductor substrate. Such a plasma apparatus is disclosed in, for example, Japanese Laid-Open Publication No. 2002-270600.

FIG. 10 is a schematic cross-sectional view showing a structure of a conventional plasma CVD apparatus 400. The plasma CVD apparatus 400 includes a plate-like cathode electrode 1 disposed in an upper portion of a container 10 in a horizontal position and a plate-like anode electrode 2 disposed in a lower portion of the container 10 in a horizontal position. The cathode electrode 1 and the anode electrode 2 are disposed in parallel to each other with a predetermined spacing therebetween. A substrate holder 3 is disposed between two electrodes. A substrate 4 is placed on and fixed to a surface (an upper surface) of the substrate holder 3.

The cathode electrode 1 in the upper portion of the container 10 may also serve as a "shower plate", i.e., a uniform ventilation distribution plate for uniformly supplying a raw material gas. The anode electrode 2 in the lower portion of the container 10 is connected to ground. A heater is integrally provided with the anode electrode 2 to heat the substrate 4 supported by the substrate holder 3.

The substrate holder 3 is supported in a movable manner in a horizontal direction by rollers 5 provided on the anode electrode 2. By rotating the rollers 5, the substrate holder 3 which supports the substrate 4 is moved in a horizontal direction with respect to a region 8 between the cathode electrode 1 and the anode electrode 2.

An exhaust system 6 is provided in the container 10. Inside the container 10 is put under a high vacuum by the exhaust system 6. A raw material gas is supplied into the container 10 under a high vacuum. The raw material gas to be supplied to the container 10 is supplied between the cathode electrode 1 and the anode electrode 2 by the cathode electrode 1 which serve as a shower plate. An RF power supply 7 applies a high-frequency voltage between the cathode electrode 1 and the anode electrode 2. Thus, plasma discharge occurs in the region 8 between the cathode electrode 1 and the anode electrode 2. Plasma formed in the region 8 decomposes the raw material gas. Thus, a thin film is formed on a surface of the substrate 4 disposed below the region 8.

In the plasma CVD apparatus 400 shown in FIG. 10, the electrode in the lower portion of the container 10 is connected to ground. Thus, the electrode in the lower portion of the container 10 is used as the anode electrode 2 and the electrode in the upper portion of the container 10 is used as the cathode electrode 1. Alternatively, the cathode electrode 1 in the upper portion of the container 10 may be connected to ground. Furthermore, the substrate holder 3 is close to the anode electrode 2 in the lower portion of the container 10. However, it may be close to the cathode electrode 1 in the upper portion of the container 10.

Japanese Laid-Open Publication No. 4-293782 discloses a substrate holder used for a plasma CVD apparatus for producing a thin film on a substrate.

In the small-size plasma CVD apparatus 400 having a structure as shown in FIG. 10, the substrate holder 3 which is movable in a horizontal direction is provided on the anode electrode 2 integrally formed with the heater. The substrate 4 is fixed to and supported by the substrate holder 3. Thus, in-line transfer for transferring the substrate holder 3 to which the substrate 4 is fixed into the container 10 is possible.

When the substrate holder as described in Japanese Laid-Open Publication No. 2002-270600 is used, the substrate holder is transferred into the container by in-line transfer.

However, in a plasma CVD apparatus in which the substrate holder is movable and in-line transfer is possible, a space 9 is formed between the substrate holder 3 and the anode electrode 2. This causes a problem that, when a voltage is applied between the cathode electrode 1 and the anode electrode 2, an unnecessary discharge occurs in the space 9.

For example, in the plasma CVD apparatus 400 shown in FIG. 10, when the rollers 5 provided on the anode electrode 2 are electrically connected to the substrate holder 3, discharge concentrates to portions around the rollers 5. Thus, uneven discharge is not formed on the surface of the substrate 4 which is fixed to the substrate holder 3 and in portions near the rollers 5.

In order to prevent occurrence of unnecessary discharge concentrated in portions around the rollers 5, it is considered to make the substrate holder itself serve as an anode electrode. Without providing another anode electrode, the substrate holder itself is made to have an electrode function and is connected to ground. Thus, no space is formed below the substrate holder, which serves as an anode electrode, thereby preventing occurrence of unnecessary discharge.

However, in such a structure, in order to make the substrate holder movable in a horizontal direction for allowing the in-line transfer, only a limited portion of the substrate holder is connected to ground. Thus, the substrate holder may not be sufficiently grounded. If the substrate holder is not sufficiently grounded entirely, plasma discharge is not uniformly formed between the substrate holder and the cathode electrode. As a result, uneven discharge such as that formed in the plasma CVD apparatus 400 shown in FIG. 10 may be undesirably generated on the substrate fixed to the substrate holder.

Furthermore, not only in a structure where the substrate holder is made movable, but also in a structure where the anode electrode and the heater are separately provided to make the heater movable, a space is formed between the substrate and the anode electrode. Thus, there is a problem that unnecessary discharge occurs in such a space.

SUMMARY OF THE INVENTION

According to one aspect of the present invention, there is provided a plasma CVD apparatus comprising an anode electrode and a cathode electrode, which is for forming a thin film on a substrate by performing plasma discharge between the anode electrode and the cathode electrode, comprising: a substrate holder disposed between the anode electrode and the cathode electrode; and one conductive member disposed between the substrate holder and one electrode of either the anode electrode or the cathode electrode, wherein the substrate holder supports the substrate, the one conductive member is provided between the one electrode and the substrate holder so as to substantially cover an entire space between the one electrode and the substrate holder, and the one conductive member is electrically connected to the one electrode and the substrate holder.

In one embodiment of the present invention, shapes of the anode electrode and the cathode electrode are plate-like shapes.

In one embodiment of the present invention, plasma discharge is performed between the anode electrode and the cathode electrode by applying a voltage between the anode electrode and the cathode electrode with a raw material gas supplied between the anode electrode and the cathode electrode.

In one embodiment of the present invention, the one conductive member includes a supporting plate provided substantially parallel to the one electrode and a plurality of conductive plates provided on an upper surface and a lower surface of the supporting plate; the upper surface of the supporting plate is a surface of the supporting plate opposing the substrate holder; the lower surface of the supporting plate is a surface of the supporting plate opposing the one electrode; the plurality of the conductive plates provided on the upper surface of the supporting plate are in contact with the substrate holder; the plurality of the conductive plates provided on the lower surface of the supporting plate are in contact with the one electrode; the shapes of the plurality of the conductive plates provided on the upper surface and the lower surface of the supporting plate are leaf-spring shapes; the plurality of conductive plates are provided on the upper surface and the lower surface of the supporting plate by attaching one edge of each of the plurality of conductive plates to the supporting plate; and the other edge of each of the plurality of the conductive plates is spaced from the supporting plate.

In one embodiment of the present invention, the one conductive member includes a supporting plate provided substantially parallel to the one electrode and a plurality of conductive plates provided on an upper surface and a lower surface of the supporting plate; the upper surface of the supporting plate is a surface of the supporting plate opposing the substrate holder; the lower surface of the supporting plate is a surface of the supporting plate opposing the one electrode; the plurality of the conductive plates provided on the upper surface of the supporting plate are in contact with the substrate holder; the plurality of the conductive plates provided on the lower surface of the supporting plate are in contact with the one electrode; the plurality of the conductive plates provided on the upper surface and the lower surface of the supporting plate are curved into arc shapes; and the plurality of conductive plates are provided on the upper surface and the lower surface of the supporting plate by attaching one edge and the other edge of each of the plurality of conductive plates provided on the upper surface and the lower surface of the supporting plate to the supporting plate.

In one embodiment of the present invention, the one conductive member includes a supporting plate provided substantially parallel to the one electrode and a plurality of conductive plates provided on an upper surface and a lower surface of the supporting plate; the upper surface of the supporting plate is a surface of the supporting plate opposing the substrate holder; the lower surface of the supporting plate is a surface of the supporting plate opposing the one electrode; the plurality of the conductive plates provided on the upper surface of the supporting plate are in contact with the substrate holder; the plurality of the conductive plates provided on the lower surface of the supporting plate are in contact with the one electrode; and the shapes of the plurality of the conductive plates provided on the upper surface and the lower surface of the supporting plate are brush shapes.

In one embodiment of the present invention, the heater is integrally attached to the one electrode.

In one embodiment of the present invention, the one conductive member is attached to the one electrode.

In one embodiment of the present invention, the one conductive member is attached to the substrate holder.

In one embodiment of the present invention, a plasma CVD apparatus further comprises a container, and the anode electrode, the cathode electrode, the substrate holder and the one conductive member are included in the container, and the one conductive member are attached to an inner surface of the container.

In one embodiment of the present invention, a plasma CVD apparatus further comprises a tension adjustment member, and the one conductive member is attached to the tension adjustment member.

According to another aspect of the present invention, there is provided a plasma CVD apparatus comprising an anode electrode and a cathode electrode, which is for forming a thin film on a substrate by performing plasma discharge between the anode electrode and the cathode electrode, comprising: a substrate holder disposed between the anode electrode and the cathode electrode; and a plurality of conductive members disposed between the substrate holder and one electrode of either the anode electrode or the cathode electrode, wherein the substrate holder supports the substrate, the plurality of conductive members are provided in parallel to each other between the one electrode and the and the substrate holder so as to cover a substantially entire space between the one electrode and the and the substrate holder, and the plurality of conductive members are electrically connected to the one electrode and the substrate holder.

In one embodiment of the present invention, shapes of the anode electrode and the cathode electrode are plate-like shapes.

In one embodiment of the present invention, plasma discharge is performed between the anode electrode and the cathode electrode by applying a voltage between the anode electrode and the cathode electrode with a raw material gas supplied between the anode electrode and the cathode electrode.

In one embodiment of the present invention, the plurality of conductive members include a supporting plate provided substantially parallel to the one electrode and a plurality of conductive plates provided on an upper surface and a lower surface of the supporting plate; the upper surface of the supporting plate is a surface of the supporting plate opposing the substrate holder; the lower surface of the supporting plate is a surface of the supporting plate opposing the one electrode; the plurality of the conductive plates provided on the upper surface of the supporting plate are in contact with the substrate holder; the plurality of the conductive plates provided on the lower surface of the supporting plate are in contact with the one electrode; the shapes of the plurality of the conductive plates provided on the upper surface and the lower surface of the supporting plate are leaf-spring shapes; the plurality of conductive plates are provided on the upper surface and the lower surface of the supporting plate by attaching one edge of each of the plurality of conductive plates to the supporting plate; and the other edge of each of the plurality of the conductive plates is spaced from the supporting plate.

In one embodiment of the present invention, the plurality of conductive members include a supporting plate provided substantially parallel to the one electrode and a plurality of conductive plates provided on an upper surface and a lower surface of the supporting plate; the upper surface of the supporting plate is a surface of the supporting plate opposing the substrate holder; the lower surface of the supporting plate is a surface of the supporting plate opposing the one electrode; the plurality of the conductive plates provided on the upper surface of the supporting plate are in contact with the substrate holder; the plurality of the conductive plates provided on the lower surface of the supporting plate are in contact with the one electrode; the plurality of the conductive plates provided on the upper surface and the lower surface of the supporting plate are curved into arc shapes; and the plurality of conductive plates are provided on the upper surface and the lower surface of the supporting plate by attaching one edge and the other edge of each of the plurality of conductive plates provided on the upper surface and the lower surface of the supporting plate to the supporting plate.

In one embodiment of the present invention, the plurality of conductive members include a supporting plate provided substantially parallel to the one electrode and a plurality of conductive plates provided on an upper surface and a lower surface of the supporting plate; the upper surface of the supporting plate is a surface of the supporting plate opposing the substrate holder; the lower surface of the supporting plate is a surface of the supporting plate opposing the one electrode; the plurality of the conductive plates provided on the upper surface of the supporting plate are in contact with the substrate holder; the plurality of the conductive plates provided on the lower surface of the supporting plate are in contact with the one electrode; and the shapes of the plurality of the conductive plates provided on the upper surface and the lower surface of the supporting plate are brush shapes.

In one embodiment of the present invention, the heater is integrally attached to the one electrode.

In one embodiment of the present invention, the plurality of conductive members are attached to the one electrode.

In one embodiment of the present invention, the plurality of conductive members are attached to the substrate holder.

In one embodiment of the present invention, a plasma CVD apparatus further comprises a container, and the anode electrode, the cathode electrode, the substrate holder and the plurality of conductive members are included in the container, the plurality of conductive members are attached to an inner surface of the container.

In one embodiment of the present invention, a plasma CVD apparatus further comprises a tension adjustment member, the one conductive member is attached to the tension adjustment member.

According to still another aspect of this invention, there is provided a method for forming a thin film on a substrate using a plasma CVD apparatus including an anode electrode and a cathode electrode, wherein the plasma CVD apparatus includes a substrate holder disposed between the anode electrode and the cathode electrode, and one conductive member disposed between the substrate holder and one electrode of either the anode electrode or the cathode electrode, the substrate holder supports the substrate, and the one conductive member is provided between the one electrode and the substrate holder so as to cover a substantially entire space between the one electrode and the substrate holder, and the one conductive member is electrically connected to the one electrode and the substrate holder, the method for forming the film comprising the steps of: (a) supplying a raw material gas between the anode electrode and the cathode electrode; and (b) performing plasma discharge between the anode electrode and the cathode electrode by applying a voltage between the anode electrode and the cathode electrode.

According to still another aspect of this invention, there is provided a method for forming a thin film on a substrate using a plasma CVD apparatus including an anode electrode and a cathode electrode, wherein the plasma CVD apparatus includes a substrate holder disposed between the anode electrode and the cathode electrode, and a plurality of conductive members disposed between the substrate holder and one electrode of either the anode electrode or the cathode electrode, the substrate holder supports the substrate, and the plurality of conductive members are provided in parallel to each other between the one electrode and the substrate holder so as to cover a substantially entire space between the one electrode and the substrate holder, and the plurality of conductive members are electrically connected to the one electrode and the substrate holder, the method for forming the film comprising the steps of: (a) supplying a raw material gas between the anode electrode and the cathode electrode; and (b) performing plasma discharge between the anode electrode and the cathode electrode by applying a voltage between the anode electrode and the cathode electrode.

According to still another aspect of this invention, there is provided a method for forming a semiconductor device using a plasma CVD apparatus including an anode electrode and a cathode electrode, wherein the plasma CVD apparatus includes a substrate holder disposed between the anode electrode and the cathode electrode, and one conductive member disposed between the substrate holder and one electrode of either the anode electrode or the cathode electrode, the substrate holder supports the substrate, the one conductive member is provided between the one electrode and the substrate holder so as to cover a substantially entire space between the one electrode and the substrate holder, and the one conductive member is electrically connected to the one electrode and the substrate holder, the method for forming the semiconductor device comprising the steps of: (a) supplying a raw material gas between the anode electrode and the cathode electrode; (b) performing plasma discharge between the anode electrode and the cathode electrode by applying a voltage between the anode electrode and the cathode electrode; and (c) forming a plurality of thin films on the substrate.

According to still another aspect of this invention, there is provided a method for forming a semiconductor device using a plasma CVD apparatus including an anode electrode and a cathode electrode, wherein the plasma CVD apparatus includes a substrate holder disposed between the anode electrode and the cathode electrode, and a plurality of conductive members disposed between the substrate holder and one electrode of either the anode electrode or the cathode electrode, the substrate holder supports the substrate, the plurality of conductive members are provided in parallel to each other between the one electrode and the substrate holder so as to cover a substantially entire space between the one electrode and the substrate holder, and the plurality of conductive members are electrically connected to the one electrode and the substrate holder, the method for forming the semiconductor device comprising the steps of: (a) supplying a raw material gas between the anode electrode and the cathode electrode; (b) performing plasma discharge between the anode electrode and the cathode electrode by applying a voltage between the anode electrode and the cathode electrode; and (c) forming a plurality of thin films on the substrate.

Thus, the invention described herein makes possible the advantages of (1) providing a plasma CVD apparatus which can suppress unnecessary discharge occurring in a gap between a substrate holder and an electrode and suppress formation of uneven discharge on a substrate, and (2) providing a method for forming a thin film and a method for forming a semiconductor device using the same.

These and other advantages of the present invention will become apparent to those skilled in the art upon reading and understanding the following detailed description with reference to the accompanying figures.

BRIEF DESCRIPTION OF THE DRAWINGS

FIG. 4A is a side view showing the structure of the conductive members.

FIG. 4B is a plan view showing the structure of the conductive members.

FIG. 5 is a plan view showing a plurality of the conductive members of another type with the anode electrode in the plasma CVD apparatus 100.

FIG. 6A is a side view showing another exemplary structure of the conductive members.

FIG. 6B is a plan view showing another exemplary structure of the conductive members.

FIG. 7A is a side view showing another exemplary structure of the conductive members.

FIG. 7B is a plan view showing another exemplary structure of the conductive members.

DESCRIPTION OF THE PREFERRED EMBODIMENTS

Hereinafter, embodiments of the present invention will be described.

Figure 1:
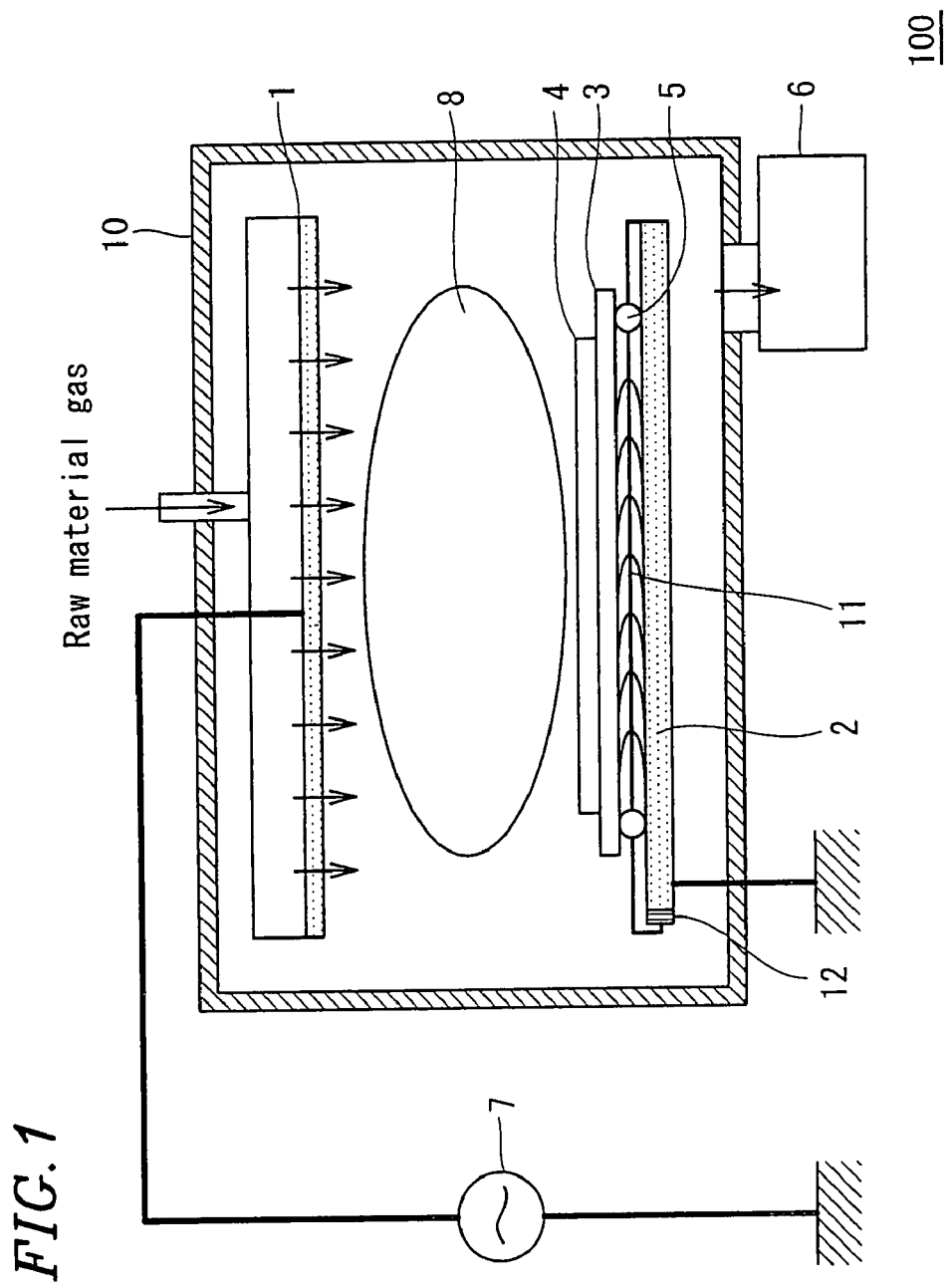
FIG. 1 is a schematic cross-sectional view showing a structure of a plasma CVD apparatus 100 according to one embodiment of the present invention.

FIG. 1 is a schematic cross-sectional view showing a structure of a plasma CVD apparatus 100 according to one embodiment of the present invention.

The plasma CVD apparatus 100 includes a container 10; a plate-like cathode electrode 1 disposed in an upper portion of the container 10 in a horizontal position; a plate-like anode electrode 2 disposed in a lower portion of the container 10 in a horizontal position, a substrate holder 3; rollers 5; an exhaust system 6; an RF power supply 7; a plurality of conductive members 11: and a tension adjustment spring 12. The cathode electrode 1 and the anode electrode 2 are disposed in parallel to each other with a predetermined spacing therebetween. The anode electrode 2 is connected to ground. The rollers 5 are provided on the anode electrode 2 in the lower portion of the container 10. The substrate holder 3 is provided in a horizontal position on the rollers 5 in a movable manner in a horizontal direction. The substrate holder 3 is moved in the horizontal direction by rotating the rollers 5. The substrate holder 3 is disposed between the cathode electrode 1 and the anode electrode 2, and supports a substrate 4. For example, the substrate 4 is mounted on and fixed to the substrate holder 3 in a horizontal position.

The RF power supply 7 is connected to the cathode 1 in the upper portion of the container 10. The high-frequency current flows through the cathode electrode 1 by the RF power supply 7. As a result, a high-frequency voltage is applied between the cathode electrode 1 and the anode electrode 2.

A raw material gas is supplied into the container 10 from outside the container 10. The raw material gas to be supplied is supplied uniformly, as in a shower by the cathode electrode 1 to a space between the cathode electrode 1 and the anode electrode 2. A heater is integrally formed with the anode electrode 2 in the lower portion of the container 10.

The exhaust system 6 is connected to the container 10. Inside the container 10 is put under a high vacuum by the exhaust system 6. With the inside of the container 10 put under a high vacuum and the raw material gas being supplied between the cathode electrode 1 and the anode electrode 2 in the container 10, when the RF power supply 7 applies a high-frequency voltage between the cathode electrode 1 and the anode electrode 2, plasma discharge occurs in a region 8 between the cathode electrode 1 and the anode electrode 2. Thus, the raw material gas is decomposed and a thin film is formed on a surface of the substrate 4.

The rollers 5 provided on the anode electrode 2 define a space between the anode electrode 2 and the substrate holder 3. A plurality of the conductive members 11 are provided in the space, each being electrically connected to the anode electrode 2 and the substrate holder 3.

A plurality of the conductive members 11 are connected (attached) to the tension adjustment spring 12. The anode electrode 2 is connected to the tension adjustment spring 12. The tension adjustment spring 12 will be described in more detail below.

Figure 2:
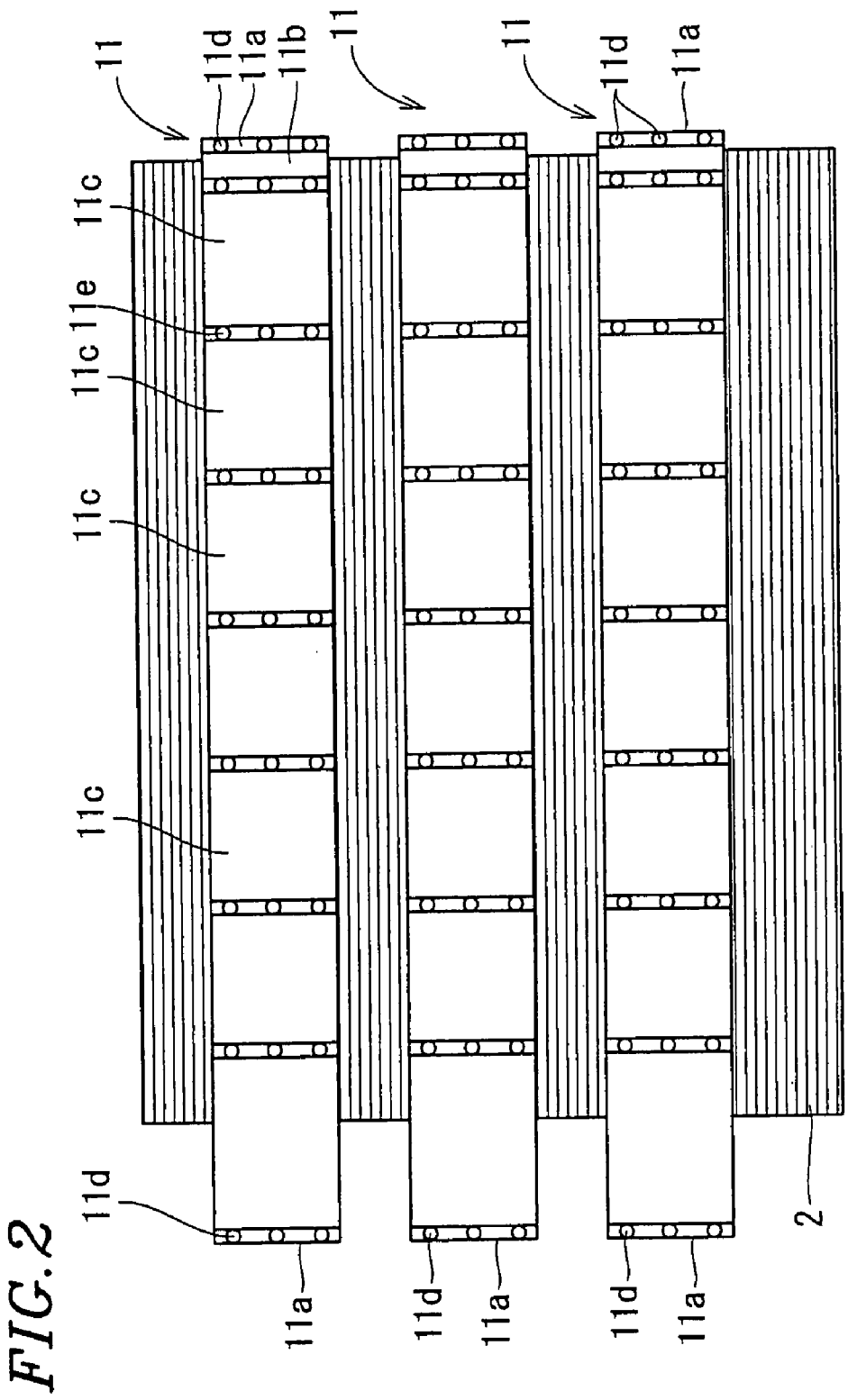
FIG. 2 is a plan view showing a plurality of conductive members with an anode electrode in the plasma CVD apparatus 100.
Figure 3:
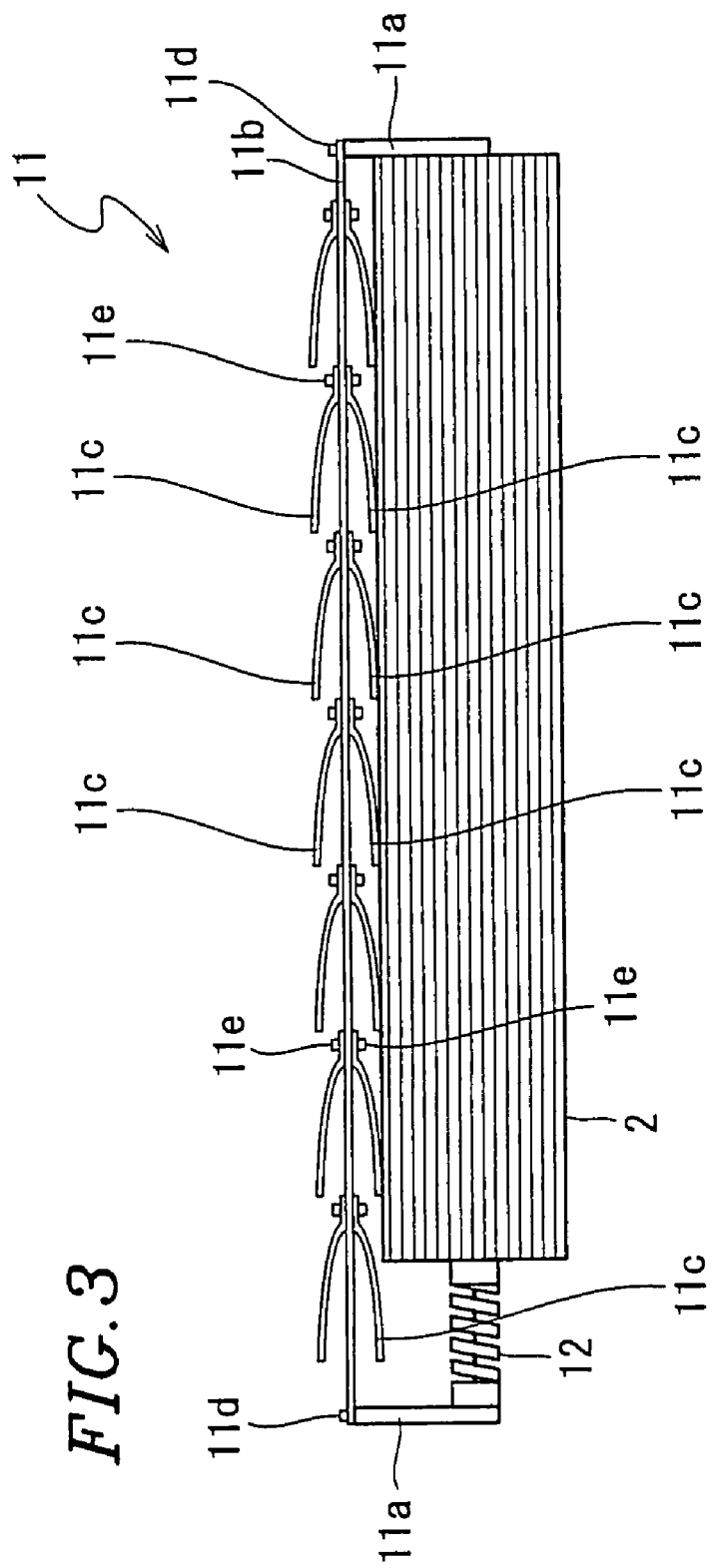
FIG. 3 is a side view showing a plurality of the conductive members with the anode electrode in the plasma CVD apparatus 100.

FIG. 2 is a plan view showing a plurality of the conductive members 11 with the anode electrode 2. FIG. 3 is a side view thereof. A plurality of the conductive members 11 are respectively disposed along a direction of motion of the substrate holder 3 disposed above the anode electrode 2, with appropriate spacing between each other in a direction perpendicular to the direction of motion of the substrate holder 3.

FIG. 4A is a schematic side view showing one of the conductive members 11 detached from the anode electrode 2. FIG. 4B is a schematic plan view thereof.

A conductive member 11 includes a plate-like supporting plate 11b disposed over the anode electrode 2 in a horizontal position and substantially parallel to the anode electrode 2; a plurality of leaf-spring-like conductive plates 11c respectively attached to an upper surface or a lower surface of the supporting plate 11b in a row along the direction of motion of the substrate holder 3; a plurality of supporting members (coupling tools) 11a; a plurality of attachment tools 11d; and a plurality of fixing tools 11e. Each of the conductive members 11 has the same structure.

The supporting plate 11b of each of the conductive members 11 is formed of, for example, a stainless steel plate having a thickness of 1 mm which has conductivity. The supporting plate 11b is bridged over the anode electrode 2 in a horizontal position, being appropriately spaced from an upper surface of the anode electrode 2, by the supporting members 11a disposed in both side ends of the anode electrode 2. Ends of the supporting plates 11b are respectively attached and fixed to the supporting members 11a by a plurality of the attachment tools 11d.

A plurality of the conductive plates 11c are provided on the upper surface of the supporting plate 11b (a surface of the supporting plate 11b opposing the substrate holder 3) and a lower surface of the supporting plate 11b (a surface of the supporting plate 11b opposing the anode electrode 2). The conductive plates 11c are stainless steel plates having a thickness of 0.1 mm which are curved into arc shapes. Edges of the conductive plates 11c of the same end in the direction of motion of the substrate holder 3 are fixed (attached) to the upper surface or the lower surface of the supporting plate 11b with the fixing tools 11e(FIG. 3). Edges of the conductive plates 11c opposite to the edges fixed with the fixing tools 11e are appropriately spaced from the upper surface or the lower surface of the supporting plate 11b. Accordingly, the edges appropriately spaced from the supporting plate 11b form leaf springs which may apply a restoring force out of the plane of the supporting plate 11b.

The conductive plates 11c disposed on the lower surface of the supporting plate 11b are in contact with the upper surface of the anode electrode 2 by restoring force. The conductive plates 11c are electrically connected to the anode electrode 2. Further, the conductive plates 11c disposed on the upper surface of the supporting plate 11b are in contact with a lower surface of the substrate holder 3 by energizing power. The conductive plates 11c are electrically connected to the substrate holder 3. The conductive plates 11c are in sliding contact with the lower surface of the substrate holder 3 when the substrate holder 3 moves in a horizontal direction. Accordingly, even the substrate holder 3 wobbles in a vertical direction when it moves, the conductive plates 11c deform so as to maintain the condition of being in contact with the substrate holder 3 and the anode electrode 2.

As a result, the anode electrode 2 and the substrate holder 3 are securely connected to the condition of being electrically connected by the conductive members 11 including the conductive plates 11c on the lower surface of the supporting plate 11b, the supporting plate 11b, and the conductive plates 11c on the supporting plate 11b.

The coupling tool 11a to which one end of the supporting plate 11b in a horizontal position is attached is screwed to one end surface of the anode electrode 2. The coupling tool 11a to which the other end of the supporting plate 11b is attached is itself attached to the other end surface of the anode electrode 2 via the tension adjustment spring 12. The tension adjustment spring 12 is screwed to the other end surface of the anode electrode 2.

As described above, the heater is integrally attached to the anode electrode 2. Since the one end of the conductive member 11 is attached to the anode electrode 2 via the tension adjustment spring 12, even when the tension adjustment spring 12 deforms due to a temperature change in the anode electrode 2 caused by the heater, the tension applied to the conductive member 11 is maintained constant. As a result, the force in accordance with a difference between thermal expansion coefficients of the conductive member 11 and the anode electrode 2 provided with the heater is applied to the conductive member 11. The force applied to the conductive member 11 is absorbed by the tension adjustment spring 12. Accordingly, deformation, fractures or the like of the conductive member 11 is prevented. Also, stress generated in the conductive member 11 due to a temperature cycle of the heater can be minimized.

In accordance with a dimension of the anode electrode 2 in a width direction which is perpendicular to the direction of motion of the substrate holder 3, it is not limited to a structure in which a plurality of the conductive members 11 are provided between the substrate holder 3 and the anode electrode 2 so as to substantially cover an entire space between the anode electrode 2 and the substrate holder 3. Alternatively, one conductive member 11 having a dimension in the width direction substantially covering an entire space between the substrate holder 3 and the anode electrode 2 may be provided between the substrate holder 3 and the anode electrode 2.

In the plasma CVD apparatus 100, the substrate 4 mounted on the substrate holder 3 in a horizontal position is in-line transferred into the container 10, being fixed to the substrate holder 3. The substrate holder 3 transferred into the container 10 is moved in a horizontal direction by the rollers 5 and placed on the conductive members 11 disposed on the anode electrode 2. Accordingly, the substrate holder 3 is in contact with the conductive plates 11c provided on the upper surface of the supporting plate 11b in the conductive member 11.

In this case, since the conductive plates 11c provided on the lower surface of the supporting plate 11b in the conductive member 11 are in contact with the upper surface of the anode electrode 2, the substrate holder 3 is electrically connected to the anode electrode 2 by the conductive plates 11c on the lower surface of the supporting plate 11b, the supporting plate 11b, and the conductive plates 11c on the upper surface of the supporting plate 11b. Thus, the potential of the substrate holder 3 and the potential of the anode electrode 2 become the same. The substrate 4 mounted on the substrate holder 3 has the same potential as the anode electrode 2 across its entirety.

The substrate holder 3 is moved in a horizontal direction by the rollers 5. The conductive plates 11c on the upper surface of the supporting plate 11b, which are in contact with the substrate holder 3, are formed into leaf-spring shapes. Thus, the conductive plates 11c deform with the conditions of being electrically connected to the substrate holder 3 maintained. Accordingly, the substrate 4 on the substrate holder 3 is secured at the same potential as the anode electrode 2.

In such a condition, inside the container 10 is put under a high vacuum by the exhaust system 6. A raw material gas is supplied into the container 10 from outside the container 10. The RF power supply 7 applies a high-frequency voltage between the cathode electrode 1 and the anode electrode 2. Further, the substrate 4 is heated by the heater provided to the anode electrode 2. Thus, plasma discharge occurs in a region 8 between the cathode electrode 1 and the anode electrode 2. The raw material gas is decomposed and a thin film is formed on a surface of the substrate 4.

In this case, the substrate 4 has the same potential as the anode electrode 2 across the region 8. The conductive property between the anode electrode 2 and the substrate holder 3 is improved. Unnecessary plasma discharge to be occurred between the anode electrode 2 and the substrate holder 3 is suppressed and the discharge power is made uniform throughout the substrate holder 3. Thus, plasma discharge occurs uniformly throughout the region 8. As a result, a thin film having a uniform thickness across the entirety is formed on the surface of the substrate 4 without formation of uneven discharge.

In the plasma CVD apparatus 100 shown in FIG. 1, the electrode in the lower portion of the container 10 is connected to ground. Thus, the electrode in the lower portion of the container 10 is used as the anode electrode 2 and the electrode in the upper portion of the container 10 is used as the cathode electrode 1. Alternatively, the cathode electrode 1 in the upper portion of the container 10 may be connected to ground. Furthermore, the substrate holder 3 is close to the anode electrode 2 in the lower portion of the container 10. However, it may be close to the cathode electrode 1 in the upper portion of the container 10.

In the present embodiment, the conductive member 11 is constructed by fixing one edge of each of the thin conductive plates 11c which are curved into arc shapes to the supporting plate 11b so as to function as a leaf spring. However, the structure of the conductive member 11 is not limited to this. For example, as shown in FIGS. 5, 6A and 6B, the conductive plates 11c curved into arc shapes are provided on the upper surface and the lower surface of the supporting plate 11b. The edges of both ends of the conductive plates 11c may be attached and fixed to the supporting plate 11b with a plurality of fixing tools 11e. In this case, the conductive plates 11c are formed into a wave-like-shape on the upper surface and the lower surface of the supporting plate 11b. The contact of the conductive plates 11c in the curved portions of the arc shapes with the anode electrode 2 and the substrate holder 3 is secured. Moreover, since the conductive plates 11c on the upper surface of the supporting plate 11b deform in accordance with the movement of the substrate holder 3, electrical connections between the substrate holder 3 and the conductive plates 11c on the upper surface of the supporting plate 11b are secured.

As shown in FIGS. 7A and 7B, a plurality of conductive portions 11f maybe formed by binding a plurality of metal wires into a brush shape. A plurality of the conductive portions 11f may be arranged into a plurality of lines along a width direction of the anode electrode 2 to the supporting plate 11b. In this case, the conductive portions 11f are fixed to the supporting plate 11b, while penetrating the supporting plate 11b in a vertical direction. The conductive portions 11f are projected from the upper surface and the lower surface of the supporting plate 11b in an upward direction and a downward direction. The conductive portions 11f are in contact with the upper substrate holder 3 and the lower anode electrode 2 and are electrically connected, respectively. Thus, the substrate holder 3 has the same potential as the anode electrode 2. Furthermore, even when the substrate holder 3 moves, sliding contact between the conductive portions 11f having a brush shape and the substrate holder 3 is secured. Thus, the substrate holder 3 is secured at the same potential as the anode electrode 2.

As described above, by providing conductive members 11 in the gap between the anode electrode 2 and the substrate holder 3, which are electrically connected to both the anode electrode 2 and the substrate holder 3, the conductive property between the anode electrode 2 and the substrate holder 3 is improved. Thus, the unnecessary plasma discharge which may occur between the anode electrode 2 and the substrate holder 3 is suppressed. As a result, discharge power is made uniform across the entirety of the substrate holder 3 and there is no possibility that uneven discharge is formed in the substrate 4.

Any conductive member, irrespective of organic or inorganic, may be used as long as the conductive property between the anode electrode 2 and the substrate holder 3 can be improved. Any material which provides a sufficient conductivity may be used, for example, aluminum, stainless steel, copper or the like. Particularly, stainless steel plates and copper plates are preferable for the conductive members 11 since they provide good conductivity even under high temperature and high vacuum.

Furthermore, shapes, attachments, or the like of the conductive members 11 are not limited. As described above, the conductive members 11 may include the leaf-spring shape or wave-like shape conductive plates 11c and brush-shape conductive portions 11f, and also, for example, movable contact type conductive portions movably connected to the anode electrode 2 and the substrate holder 3.

Figure 8:
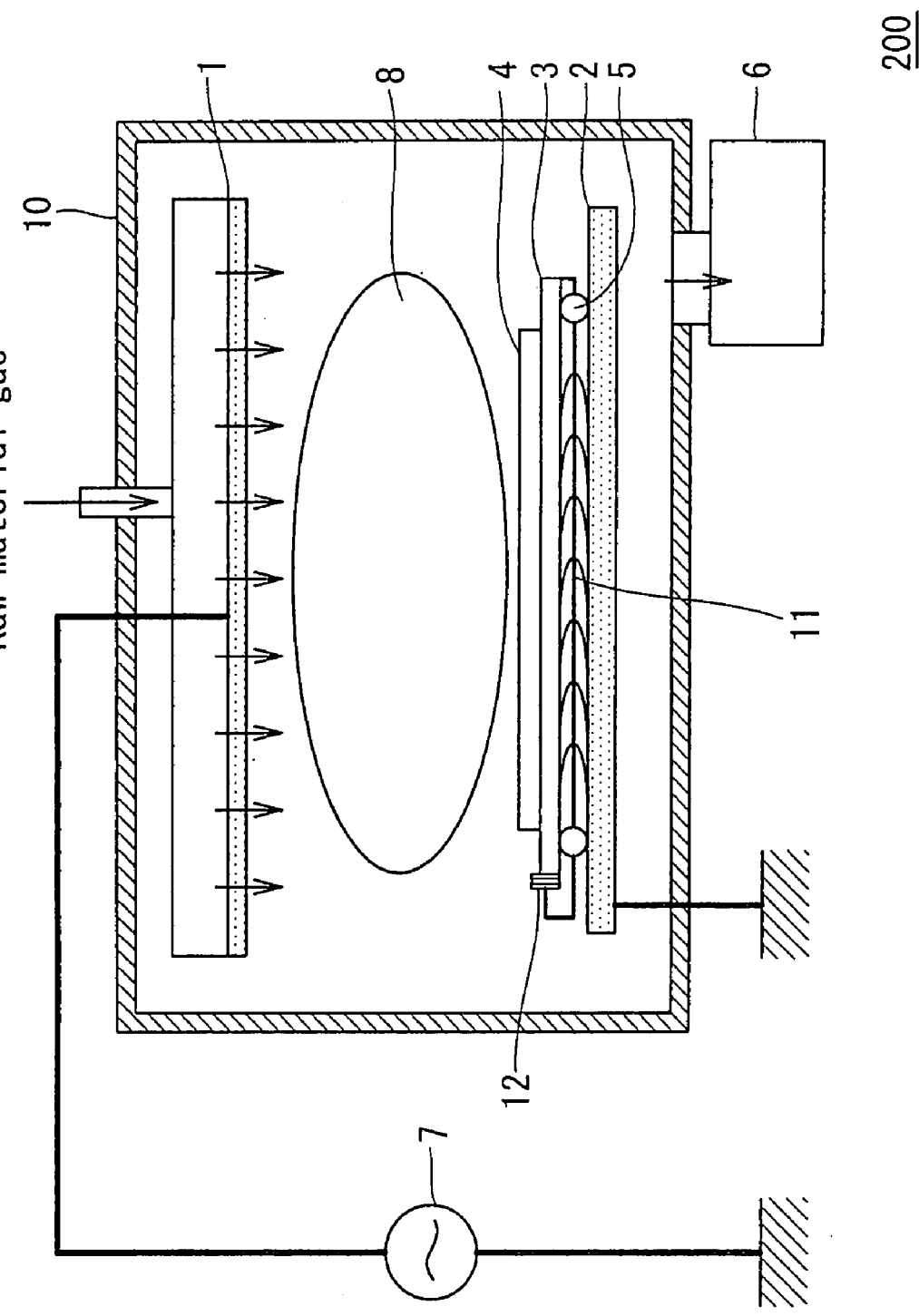
FIG. 8 is a cross-sectional view showing a plasma CVD apparatus 200 according to the present invention.

In the plasma CVD apparatus 100 according to the above-described embodiment, the conductive members 11 are attached to the anode electrode 2 via the tension adjustment spring 12. However, as in a plasma CVD apparatus 200 shown in FIG. 8, the conductive members 11 may be attached to the substrate holder 3 via the tension adjustment spring 12. In this case, a change in design of the plasma CVD apparatus required for providing the conductive members 11 can be minimized. Furthermore, when a conductive member 11 is worn out, an operation for exchanging the conductive member 11 can be readily performed.

Figure 9:
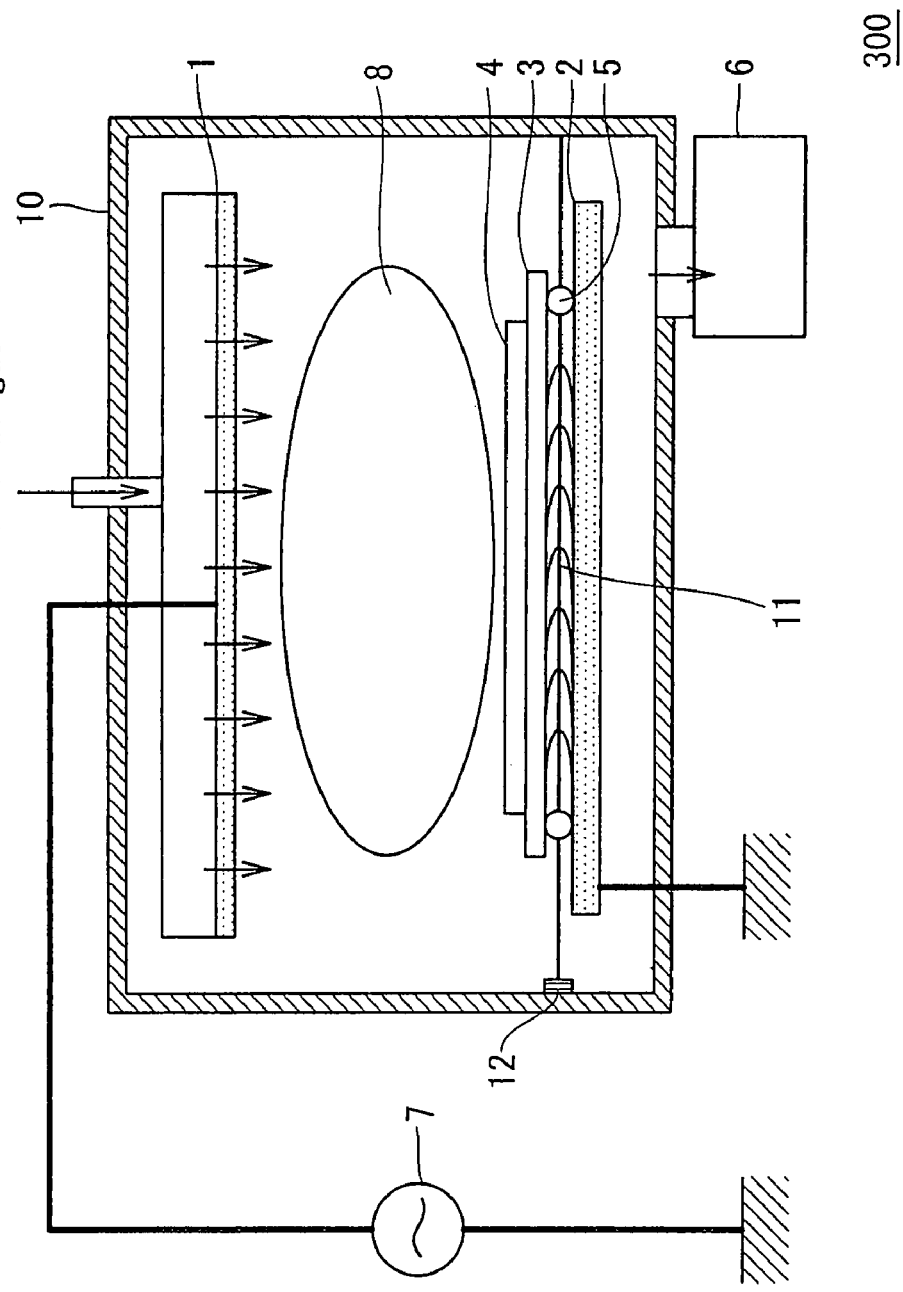
FIG. 9 is a cross-sectional view showing a plasma CVD apparatus 300 according to the present invention.
Figure 10:
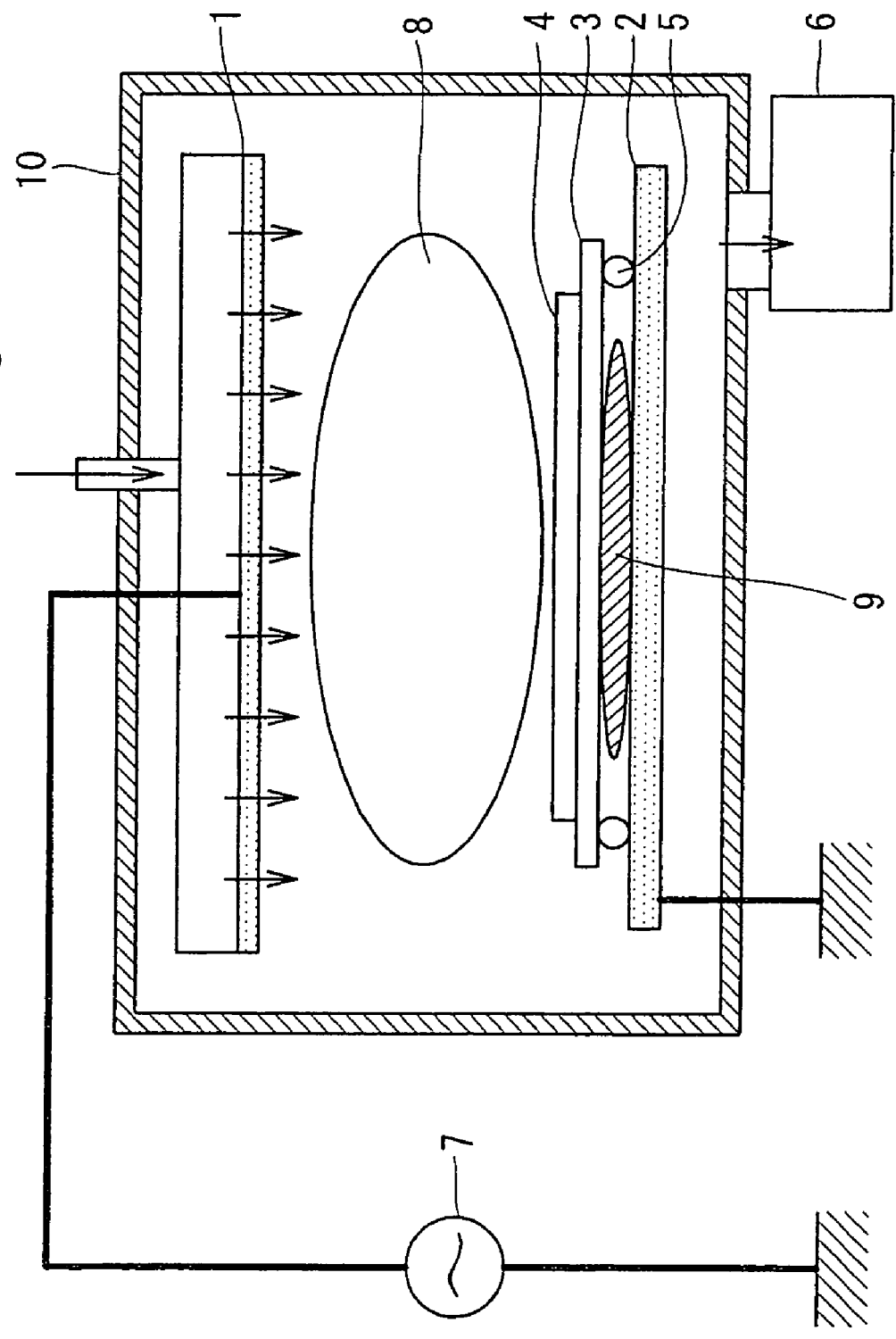
FIG. 10 is a cross-sectional view showing a conventional plasma CVD apparatus 400.

Further, as in a plasma CVD apparatus 300 shown in FIG. 9, the conductive members 11 disposed between the substrate holder 3 and the anode electrode 2 may be attached to an inner surface of the container 10 via the tension adjustment spring 12. In this case, by connecting the container 10 to ground, the conductive members 11 are at a ground potential. Thus, the anode electrode 2 and the substrate holder 3 can be at a ground potential via the conductive members 11. Accordingly, it is possible to make the heater provided to the anode electrode 2 of a material having low conductivity, such as carbon or the like. When the conductive members 11 are attached to the inner surface of the container 10 via the tension adjustment spring 12, operations required for exchanging the heater can be reduced compared to the case where the conductive members 11 are fixed to the anode electrode 2 provided with the heater.

In the plasma CVD apparatus 200 and the plasma CVD apparatus 300, the electrode in the lower portion of the container 10 is connected to ground. Thus, the electrode in the lower portion of the container 10 is used as the anode electrode 2 and the electrode in the upper portion of the container 10 is used as the cathode electrode 1. Alternatively, the cathode electrode 1 in the upper portion of the container 10 may be connected to ground. Furthermore, the substrate holder 3 is close to the anode electrode 2 in the lower portion of the container 10. However, it may be close to the cathode electrode 1 in the upper portion of the container 10. In the case where the substrate holder 3 is close to the cathode electrode 1, the conductive members 11 are provided between the substrate holder 3 and the cathode electrode 1.

The plasma CVD apparatuses 100, 200 and 300 according to the present invention may be applied in a wide range of uses and it is possible to form various types of thin films. For example, a mixed gas of silane and hydrogen may be supplied to the container 10 via the cathode electrode 1 which serves as a shower plate, and power is applied between the anode electrode 2 and cathode electrode 1 from the RF power supply 7 with pressure inside the container 10 properly adjusted. Thus, an amorphous silicon thin film can be formed on the substrate 4 placed on the substrate holder 3.

In the plasma CVD apparatus 100, 200 and 300 according to the present invention, it is possible to form various types of thin films such as thin films of silicon nitride, silicon oxide, microcrystalline silicon, polycrystalline silicon, silicon carbide, diamond and the like by changing the inner pressure of the container 10 and the RF power.

In the case where the plasma CVD apparatus 100, 200 and 300 according to the present invention is used, a raw material gas is supplied between the anode electrode 2 and the cathode electrode 1 and a voltage is applied between the anode electrode 2 and the cathode electrode 1. Then, plasma discharge occurs between the anode electrode 2 and the cathode electrode 1, and a plurality of thin films are formed on the semiconductor substrate. Thus, it is possible to form a semiconductor device such as a thin film solar battery, a thin film transistor (TFT) and the like.

In the plasma CVD apparatus 100, 200 and 300 according to the present invention, the cathode electrode 1 and the anode electrode 2 are disposed in a horizontal position as well as the substrate 4. The present invention is not limited to such a structure. The cathode electrode 1, the anode electrode 2 and the substrate 4 maybe disposed in a vertical position or a predetermined inclined position.

The present invention has been illustrated by using the preferable embodiments of the present invention. However, the present invention should not be construed with limitation to such embodiments. It is understood that the scope of the present invention should be construed only from the claims. It is understood that, based on the descriptions regarding the specific preferable embodiments, those skilled in the art can carry out the scope of the descriptions as described herein and also the scope equivalent thereto based on the common technical knowledge. It is understood that the patents, patent applications, and other documents cited herein should be herein incorporated as if the contents thereof are specifically described herein.

As described above, the plasma CVD apparatus according to the present invention is provided with the conductive members between the substrate holder and either one of the anode electrode or the cathode electrode, where the conductive members are electrically connected to both of them. Thus, a uniform discharge potential can be obtained throughout the entire substrate holder. As a result, unnecessary plasma discharge can be suppressed to make the discharge power uniform. Thus, efficiency in power utilization can be improved. The thickness of the film to be formed can be made uniform to improve the quality of the film. Furthermore, according to the present invention, by using such a plasma CVD apparatus, a thin film and a semiconductor device of good quality can be formed.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A plasma CVD apparatus comprising an anode electrode and a cathode electrode, which is for forming a thin film on a substrate by performing plasma discharge between the anode electrode and the cathode electrode, comprising:

a substrate holder disposed between the anode electrode and the cathode electrode; and
   one conductive member disposed between the substrate holder and one electrode of either the anode electrode or the cathode electrode, wherein
   the substrate holder supports the substrate,
   the one conductive member is provided between the one electrode and the substrate holder so as to substantially cover an entire space between the one electrode and the substrate holder,
   the one conductive member is electrically connected to the one electrode and the substrate holder; and
   the conductive member includes: a support plate, each end portion of which is attached to each end portion on both sides of the one electrode such that the conductive member is positioned parallel to the electrically connected one electrode with a space in between; and a plurality of conductive plates or brush-like conductive portions provided for each surface of the support plate facing each of the one electrode and the substrate holder, and the each conductive plate or the each conductive portion is in contact with the one electrode and the substrate holder.

2. A plasma CVD apparatus according to claim 1, wherein shapes of the anode electrode and the cathode electrode are plate-like shapes.

3. A plasma CVD apparatus according to claim 1, wherein plasma discharge is performed between the anode electrode and the cathode electrode by applying a voltage between the anode electrode and the cathode electrode with a raw material gas supplied between the anode electrode and the cathode electrode.

4. A plasma CVD apparatus according to claim 1, wherein a heater is integrally attached to the one electrode.

5. A plasma CVD apparatus according to claim 1, further comprising a tension adjustment member, the one conductive member being attached to the tension adjustment member.

6. The apparatus of claim 1, wherein the conductive member comprises a plurality of spaced apart conductive members that are in electrical communication with each other.

\* \* \* \* \*